United States Patent
Zhang

[11] Patent Number: 5,998,103
[45] Date of Patent: Dec. 7, 1999

[54] ADHESION PROMOTION METHOD EMPLOYING GLYCOL ETHER ACETATE AS ADHESION PROMOTER MATERIAL

[75] Inventor: Ai-Qiang Zhang, Singapore, Singapore

[73] Assignee: Chartered Semiconductor Manufacturing, Ltd., Singapore, Singapore

[21] Appl. No.: 09/055,441

[22] Filed: Apr. 6, 1998

[51] Int. Cl.$^6$ .................................................. G03F 7/00
[52] U.S. Cl. ........................ 430/327; 430/954; 427/207.1
[58] Field of Search .................................. 430/327, 954; 427/207.1

[56] References Cited

U.S. PATENT DOCUMENTS

| | | | |
|---|---|---|---|
| 4,692,398 | 9/1987 | Durham | 430/329 |
| 4,732,858 | 3/1988 | Brewer | 430/272.1 |
| 4,806,458 | 2/1989 | Durham | 430/331 |
| 4,983,490 | 1/1991 | Durham | 430/169 |
| 5,391,397 | 2/1995 | Mukerji | 427/207.1 |
| 5,618,655 | 4/1997 | Davidson | 430/347 |
| 5,795,699 | 8/1998 | Zhou | 430/320 |

*Primary Examiner*—Kathleen Duda
*Assistant Examiner*—Nicole Barreca
*Attorney, Agent, or Firm*—George O. Saile; Rosemary L.S. Pike; Alex P. Szecsy

[57] ABSTRACT

A method for forming a hydrophobic material layer upon a hydrophilic material layer over a substrate. There is first provided a substrate. There is then formed over the substrate a hydrated hydrophilic material layer. There is then treated the hydrated hydrophilic material layer with a glycol ether acetate material in the absence of an organofunctional silane material to form a glycol ether derivatized hydrophilic material layer having a glycol ether moiety covalently bonded thereto through condensation of the hydrated hydrophilic material layer with the glycol ether acetate material. Finally, there is then formed upon the glycol ether derivatized hydrophilic material layer a hydrophobic material layer. The method is particularly useful in enhancing adhesion onto hydrated hydrophilic material layers of positive photoresist material layers whose solubility in a developer results from a photogenerated acid material.

11 Claims, 7 Drawing Sheets

ADHESION PROMOTION METHOD EMPLOYING GLYCOL ETHER ACETATE AS ADHESION PROMOTER MATERIAL

BACKGROUND OF THE INVENTION

1. Field of the Invention

The present invention relates generally to adhesion between hydrophobic material layers formed upon hydrophilic material layers within fabrications such as but not limited to microelectronics fabrications. More particularly, the present invention relates to methods for promoting adhesion between hydrophobic material layers formed upon hydrophilic material layers within fabrications such as but not limited to microelectronics fabrications.

2. Description of the Related Art

Microelectronics fabrications are formed from microelectronics substrates over which are formed patterned microelectronics conductor layers which are separated by microelectronics dielectric layers.

In the process of forming microelectronics fabrications, it is common in the art of microelectronics fabrication to encounter microelectronics processing steps where it is required to adhere a hydrophobic material layer, such as but not limited to an organic polymer hydrophobic material layer such as a photoresist material layer, onto a hydrophilic material layer, such as but not limited to a hydrated oxide hydrophilic material layer. In general, within fabrications such as but not limited to microelectronics fabrications, hydrophobic material layers are intended as material layers having a sessile deionized water drop contact angle of greater than about 55 degrees with respect to the hydrophobic material layer surface while hydrophilic material layers are intended as material layers having a sessile deionized water drop contact angle of less than about 55 degrees with respect to the hydrophilic material layer surface.

Conventionally, it is common in the art of microelectronics fabrication to employ an organofunctional silane coupling agent material bearing both a hydrophobic group and a condensable hydrophilic group to form an organofunctional silane coupling agent material layer interposed between the hydrophobic material layer and the hydrophilic material layer in order to enhance adhesion between the hydrophobic material layer and the hydrophilic material layer. A particularly common organofunctional silane coupling agent material employed for forming such organofunctional silane coupling agent material layers within microelectronics fabrications is hexamethyldisilazane (HMDS).

While hexamethyldisilazane (HMDS) is commonly employed when forming organofunctional silane coupling agent material layers interposed between hydrophobic material layers and hydrophilic material layers within microelectronics fabrications, hexamethyldisilazane (HMDS) derived organofunctional silane coupling agent material layers are not entirely without problems when employed as adhesion promoter layers interposed between hydrophobic material layers and hydrophilic materials layers within microelectronics fabrications. In particular, it has been observed within microelectronics fabrications employing hexamethyldisilazane (HMDS) organofunctional silane coupling agent material layers interposed between positive deep ultraviolet (DUV) hydrophobic photoresist material layers and hydrated hydrophilic silicon containing material layers that the positive deep ultraviolet (DUV) hydrophobic photoresist material layers are often not uniformly developed after photoexposure. A series of schematic cross-sectional diagrams illustrating a microelectronics fabrication having formed therein such a non-uniformly developed positive deep ultraviolet (DUV) hydrophobic photoresist layer is illustrated in FIG. 1 to FIG. 4.

Figure 1:
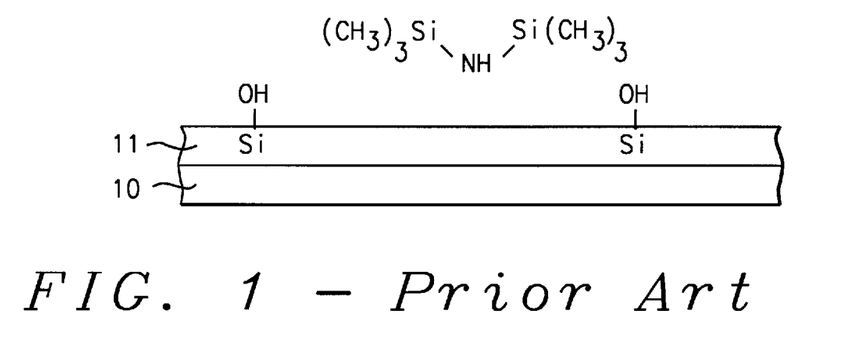
FIG. 1 to FIG. 4 show a series of schematic cross-sectional diagrams illustrating the results of forming a partially patterned positive deep ultra-violet (DUV) hydrophobic photoresist layer upon a trimethylsilyl derivatized hydrophilic silicon containing layer when employing a hexamethyldisilazane (HMDS) silylating material in accord with a method conventional in the art of microelectronics fabrication.

Shown in FIG. 1 is a substrate 10 employed within a microelectronics fabrication, where the substrate 10 has formed thereupon a hydrated hydrophilic silicon containing layer 11. As is illustrated within FIG. 1, the hydrated hydrophilic silicon containing layer 11 has pendent hydroxyl (—OH) groups covalently bonded thereupon which provide at least in part the hydrophilic character to the hydrated hydrophilic silicon containing layer 11. Shown also in FIG. 1 is a molecule of hexamethyldisilazane (HMDS) in the vicinity of the surface of the hydrated hydrophilic silicon containing layer 11.

Figure 2:
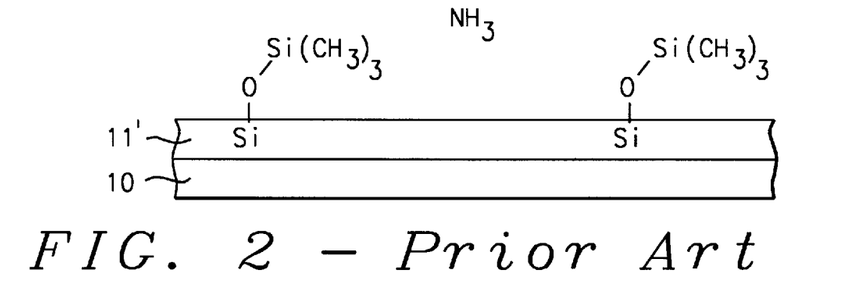

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the hexamethyldisilazane (HMDS) molecule has reacted with the pendant covalently bonded hydroxyl (—OH) groups to for a covalently bonded trimethylsilyl derivatized hydrophobic silicon containing layer 11' and ammonia, or in the alternative some lower order alkyl amine derived from the hexamethyldisilazane (HMDS).

Figure 3:
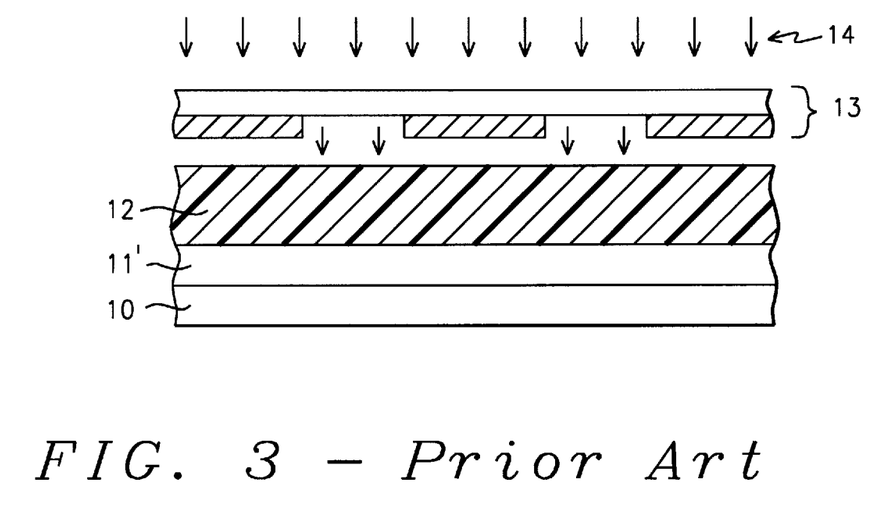

Referring now to FIG. 3, there is show a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein there is formed upon the trimethylsilyl derivatized hydrophobic silicon containing layer 11' a blanket positive deep ultraviolet (DUV) hydrophobic photoresist layer 12 which is photoexposed through a photoexposure reticle 13 while employing a deep ultraviolet (DUV) photoexposure radiation beam 14.

Figure 4:
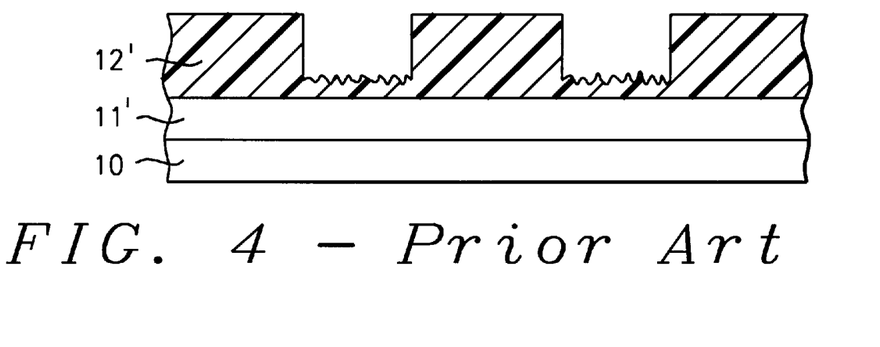

Referring now to FIG. 4, there is shown a schematic cross-sectional diagram illustrating the results of further processing of the microelectronics fabrication whose schematic cross-sectional diagram is illustrated in FIG. 3. Shown in FIG. 4 is a microelectronics fabrication otherwise equivalent to the microelectronics fabrication whose schematic cross-sectional diagram is illustrated in FIG. 3, but wherein the photoexposed blanket positive deep ultraviolet (DUV) hydrophobic photoresist layer 12 has been developed to form the partially patterned positive deep ultraviolet (DUV) hydrophobic photoresist layer 12'. As is illustrated within the schematic cross-sectional diagram of FIG. 4, the partially patterned positive deep ultraviolet (DUV) hydrophobic photoresist layer 12' is incompletely patterned with residue layers formed most closely adjoining the trimethylsilyl derivatized hydrophobic silicon containing layer 11', as well as "T" top protrusions defining the upper surfaces of apertures formed within the partially patterned deep ultraviolet (DUV) hydrophobic photoresist layer 12'.

Partially patterned photoresist layers, such as the partially patterned positive deep ultraviolet (DUV) hydrophobic photoresist layer 12' as illustrated within the schematic cross-sectional diagram of FIG. 4, are undesirable within microelectronics fabrication since they impede proper patterning of layers formed beneath those partially patterned photoresist layers.

Beyond the foregoing problem pertaining to difficulty in forming a fully patterned positive deep ultraviolet (DUV) hydrophobic photoresist layer upon a trimethylsilyl derivatized hydrophobic silicon containing layer while employing a hexamethyldisflazane (HMDS) organofunctional silane coupling agent material layer within a microelectronics fabrication, hexamethyldisilazane (HMDS) organofunctional silane coupling agent materials are generally also known as expensive materials in comparison with many other materials which are employed within microelectronics fabrication, thus contributing to added microelectronics fabrication cost. Finally, hexamethyldisilazane HMDS) organofunctional silane coupling agent materials are often also known as particularly toxic materials in comparison with many other materials which are employed in microelectronics fabrication. Such toxicity generally requires that hexamethyldisilazane (HMDS) organofunctional silane coupling agent materials require special handling when employed within microelectronics fabrication.

It is thus desirable within the art of microelectronics fabrication to provide methods and materials through which adhesion between hydrophobic material layers formed upon hydrophilic material layers within microelectronics fabrications may be enhanced without the use of hexamethyldisilazane (HMDS) organofunctional silane adhesion promoter material layers formed interposed between the hydrophobic material layers and the hydrophilic material layers. It is towards that goal the present invention is directed.

Various methods and materials have been disclosed in the art of microelectronics fabrication for fabricating photoresist layers and photoresist materials which may be employed within microelectronics fabrications.

For example, Durham, in U.S. Pat. No. 4,806,458 and U.S. Pat. No. 4,692,398, discloses a photoresist stripping composition, and a method for stripping a photoresist layer from a microelectronics substrate while employing the photoresist stripping composition, where the photoresist stripping composition employs a hexaalkyldisflazane, such as hexamethyldisilazane (HMDS), within a solvent composition comprising at least one of a propylene glycol alkyl ether and a propylene glycol alkyl ether acetate. The photoresist stripping composition when dried to a tack free state may also serve as an adhesion promoter layer for promoting adhesion of a photoresist material layer formed over the microelectronics substrate.

In addition, Davidson, in U.S. Pat. No. 5,618,655, discloses a method for reducing trace metal impurity levels within photoresist materials employed within microelectronics fabrications. The method employs an aqueous alkaline extraction of the trace metal impurities from the photoresist materials through use of an immiscible co-solvent mixture which may include as one of the solvent components propylene glycol methyl ether acetate.

Desirable in the art of microelectronics fabrication are methods and materials through which hydrophobic material layers, such as photoresist layers, may be formed upon hydrophilic material layers, such as hydrated oxide layers, within microelectronics fabrications, with enhanced adhesion without employing hexamethyldisilazane (HMDS) organofunctional silane adhesion promoter material layers interposed between the hydrophobic material layers and the hydrophilic material layers. It is towards that goal that the present invention is directed.

SUMMARY OF THE INVENTION

A first object of the present invention is to provide a method for forming a hydrophobic material layer, such as but not limited to a photoresist layer, upon a hydrophilic material layer, such as but not limited to a hydrated oxide layer, with enhanced adhesion within a fabrication such as but not limited to a microelectronics fabrication.

A second object of the present invention is to provide a method in accord with the first object of the present invention, where adhesion of the hydrophobic material layer upon the hydrophilic material layer is enhanced without employing a hexamethyldisilazane (HMDS) organofunctional silane adhesion promoter material layer formed interposed between the hydrophobic material layer and the hydrophilic material layer.

A third object of the present invention is to provide a method in accord with the first object of the present invention and the second object of the present invention, which method is readily commercially implemented.

In accord with the objects of the present invention, there is provided by the present invention a method for forming a hydrophobic material layer upon a hydrophilic material layer over a substrate. To practice the method of the present invention, there is first provided a substrate. There is then formed over the substrate a hydrated hydrophilic material layer. There is then treated the hydrated hydrophilic material layer with a glycol ether acetate material in the absence of an organofunctional silane material to form a glycol ether derivatized hydrophilic material layer having a glycol ether moiety covalently bonded thereto through condensation of the hydrated hydrophilic material layer with the glycol ether acetate material. Finally, there is then formed upon the glycol ether derivatized hydrophilic material layer a hydrophobic material layer.

There is provided by the present invention a method for forming a hydrophobic material layer, such as but not limited to a photoresist layer, upon a hydrophilic material layer, such as but not limited to a hydrated oxide layer, with enhanced adhesion within a fabrication such as but not limited to a microelectronics fabrication, where the enhanced adhesion of the hydrophobic material layer upon the hydrophilic material layer is effected without employing a hexamethyldisilazane (HMDS) organofunctional silane adhesion promoter material layer formed interposed between the hydrophobic material layer and the hydrophilic material layer. The method of the present invention realizes the foregoing object by treating a hydrated hydrophilic material layer with a glycol ether acetate material to form a glycol ether derivatized hydrophilic material layer having a glycol ether moiety covalently bonded thereto through condensation of the hydrated hydrophilic material layer with the glycol ether acetate material. The glycol ether derivatized hydrophilic material layer has a hydrophobic surface which promotes adhesion of a hydrophobic material layer formed upon the glycol ether derivatized hydrophilic material layer.

The method of the present invention is readily commercially implemented. The method of the present invention provides that a glycol ether acetate material is employed to form from a hydrated hydrophilic material layer a glycol ether derivatized hydrophilic material layer which has a hydrophobic surface which promotes adhesion of a hydrophobic material layer formed upon the glycol ether derivatized hydrophilic material layer. Since glycol ether acetate materials are generally known within several arts, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENT

The present invention provides a method for forming over a substrate which may be employed within a microelectronics fabrication a hydrophobic material layer upon a hydrophilic material layer, with enhanced adhesion, without employing an organofunctional silane adhesion promoter material layer, such as a hexamethyldisilazane (HMDS) organofunctional silane adhesion promoter material layer, formed interposed between the hydrophobic material layer and the hydrophilic material layer. The present invention realizes the foregoing object by employing rather than an organofunctional silane adhesion promoter material for forming an adhesion promoter material layer a glycol ether acetate material to form from the hydrated hydrophilic material layer a glycol ether derivatized hydrophilic material layer having a glycol ether moiety covalently bonded thereto through condensation of the hydrated hydrophilic material layer with the glycol ether acetate material. The glycol ether derivatized hydrophilic material layer provides a hydrophobic surface which enhances adhesion of a hydrophobic material layer formed thereupon.

Although the present invention provides value when there is desired to enhance adhesion of a hydrophobic photoresist material layer upon a hydrated hydrophilic oxide material layer within an integrated circuit microelectronics fabrication, the method of the present invention may be employed in forming hydrophobic material layers other than photoresist layers upon hydrophilic material layers other than hydrated oxide layers, with enhanced adhesion and without employing organofunctional silane adhesion promoter material layers, within fabrications other than integrated circuit microelectronics fabrications. In that regard, the method of the present invention may be employed in forming hydrophobic material layers such as but not limited to organic polymer layers other than photoresist layers upon hydrophilic material layers such as but not limited to oxidized and subsequently hydrated metal layers and silicon layers within fabrications including but not limited to decorative and functional fabrications, as well as microelectronics fabrications including but not limited to integrated circuit microelectronics fabrications, solar cell microelectronics fabrications, ceramic substrate microelectronics fabrications and flat panel display microelectronics fabrications.

First Preferred Embodiment

Figure 5:
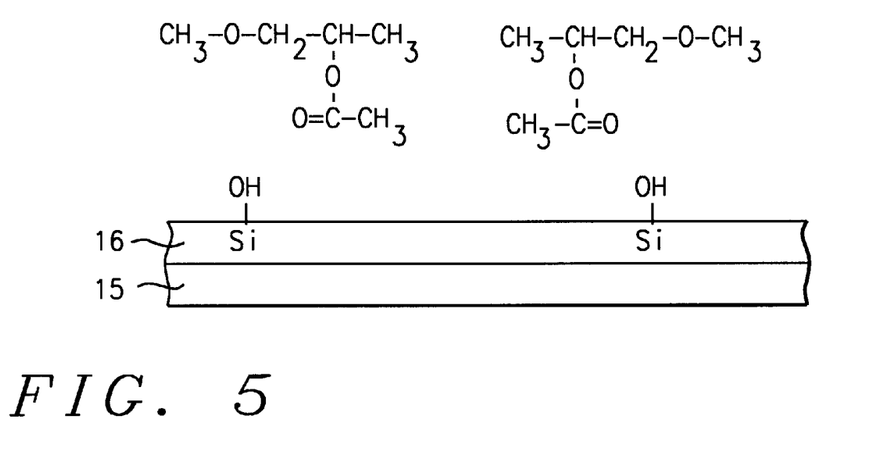
FIG. 5 to FIG. 8 show a series of schematic cross-sectional diagrams illustrating the results of forming within a microelectronics fabrication in accord with a general embodiment of the present invention which comprises a first preferred embodiment of the present invention a series of fully patterned positive hydrophobic photoresist layers upon a glycol ether derivatized hydrophilic silicon containing layer while employing a propylene glycol methyl ether acetate derivatizing material in accord with the method of the present invention.

Referring now to FIG. 5 to FIG. 8, there is shown a series of schematic cross-sectional diagrams illustrating the results of forming within a microelectronics fabrication in accord with a general embodiment of the present invention which comprises a first preferred embodiment of the present invention a series of frilly patterned positive hydrophobic photoresist material layers upon a glycol ether derivatized hydrophilic silicon containing layer while employing a propylene glycol methyl ether acetate derivatizing material. Shown in FIG. 5 is a schematic cross-sectional diagram of the midcroelectronics fabrication at an early stage in its fabrication.

Shown in FIG. 5 is a substrate 15 employed within a microelectronics fabrication, where the substrate has formed thereover a hydrated hydrophilic silicon containing layer 16. Within the first preferred embodiment of the present invention, the microelectronics fabrication may be selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 5, within the first preferred embodiment of the present invention the substrate 15 may be the substrate itself employed within the microelectronics fabrication, or in the alternative, the substrate 15 may be the substrate employed within the microelectronics fabrication, where the substrate has formed thereupon or thereover any of several additional microelectronics layers as are conventionally employed within the microelectronics fabrication. Such additional microelectronics layers may include, but are not limited to, microelectronics conductor layers, microelectronics semiconductor layers and microelectronics dielectric layers.

With respect to the hydrated hydrophilic silicon containing layer 16, within the first preferred embodiment of the present invention the hydrated hydrophilic silicon containing layer 16 may be formed from any of several silicon containing materials which are readily hydrated. Such silicon containing materials include, but are not limited to silicon oxide materials, silicon oxynitride materials and silicon materials, such as but not limited to amorphous silicon materials, monocrystalline silicon materials and polycrystalline silicon materials which have a native oxide formed thereupon under ambient conditions. Typically and preferably, the hydrated hydrophilic silicon containing layer 16 is hydrated through sorbtion of moisture under ambient conditions of temperature and humidity to which the hydrated hydrophilic silicon containing layer 16 is exposed. As is illustrated in FIG. 5, the hydrated hydrophilic silicon containing layer 16 has hydroxyl groups pendant therefrom and covalently bonded thereto. Typically and preferably, the hydrated hydrophilic silicon containing layer 16 is formed to a thickness of from about 1000 to about 20000 angstroms over the substrate 15.

As is understood by a person skilled in the art, the hydrated hydrophilic silicon containing layer 16, although illustrated as a silicon containing layer within the first preferred embodiment of the present invention may also be formed from other materials which are readily hydrated at ambient conditions of temperature and humidity to which the hydrated hydrophilic silicon containing layer 16 is exposed. Such other materials include: (1) oxides and ceramics including materials other than silicon containing materials; and (2) various metals, such as but not limited to aluminum, aluminum alloys, copper, copper alloys, titanium and titanium alloys, which are readily oxidized and subsequently hydrated at ambient conditions of temperature and humidity to which the hydrated hydrophilic silicon containing layer 16 is exposed.

Finally, there is shown in FIG. 5 a pair of propylene glycol methyl ether acetate molecules in the vicinity of the surface of the hydrated hydrophilic silicon containing layer 16. Within the first preferred embodiment of the present invention, the propylene glycol methyl ether acetate molecules may be present in the vicinity of the surface of the hydrated hydrophilic silicon containing layer 16 as either a liquid (through methods including but not limited to immersion methods and spin coating methods involving the substrate 15) or a vapor (through methods including but not limited to vapor coating methods involving the substrate 15), at either elevated or reduced temperatures and pressures. For the first preferred embodiment of the present invention, the propylene glycol methyl ether acetate molecules are preferably provided in the vicinity of the hydrated hydrophilic silicon containing layer 16 as a vapor at a temperature of from about 85 to about 95 degrees centigrade and a pressure of from about 750 to about 770 torr.

Absent within the first preferred embodiment of the present is the presence of an organofunctional silane adhesion promoter material molecule, such as a hexamethyldisilazane (HMDS) organofunctional silane adhesion promoter material molecule in the vicinity of the surface of the hydrated hydrophilic silicon containing layer 16.

Figure 6:
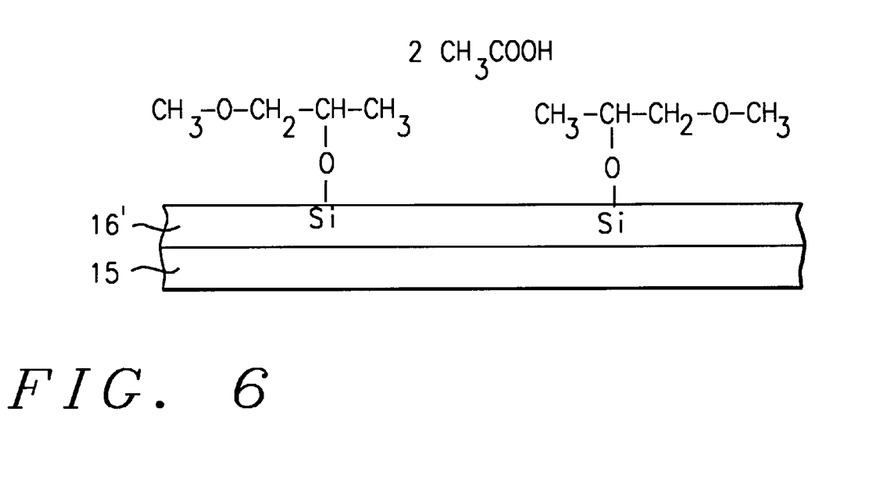

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein the propylene glycol methyl ether acetate molecules have condensed and covalently bonded with the hydroxyl groups to form a propylene glycol methyl ether derivatized silicon containing layer 16', along with a molar quantity of acetic acid. The propylene glycol methyl ether derivatized silicon containing layer 16' provides a hydrophobic surface which enhances adhesion of a hydrophobic material layer formed upon the propylene glycol methyl ether derivatized silicon containing layer 16'. Typical reaction conditions under which the propylene glycol methyl ether acetate molecules will react with the pendent hydroxyl groups of the hydrated hydrophilic silicon containing layer 16 to form the propylene glycol methyl ether derivatized silicon containing layer 16' and the resulting acetic acid byproduct include the temperature of about 85 to about 95 degrees centigrade for a time period of from about 0.5 to about 1.5 minutes.

As is understood by a person skilled in the art, although the first preferred embodiment of the present invention employs propylene glycol methyl ether acetate as a derivatizing material for forming the propylene glycol methyl ether derivatized silicon containing layer 16', glycol ether acetates other than propylene glycol methyl ether acetate may be employed as a hydrophilic material layer derivatizing agent within the method of the present invention. Such other glycol ether acetates may include, but are not limited to, other glycol alkyl ether acetates, as well as glycol non-alkyl ether acetates, either of which may be derived from longer chain glycols than propylene glycol, or in the alternative from cyclic glycols. Within the method of the present invention, however, propylene glycol methyl ether acetate is most preferred due to economic considerations.

Figure 7:
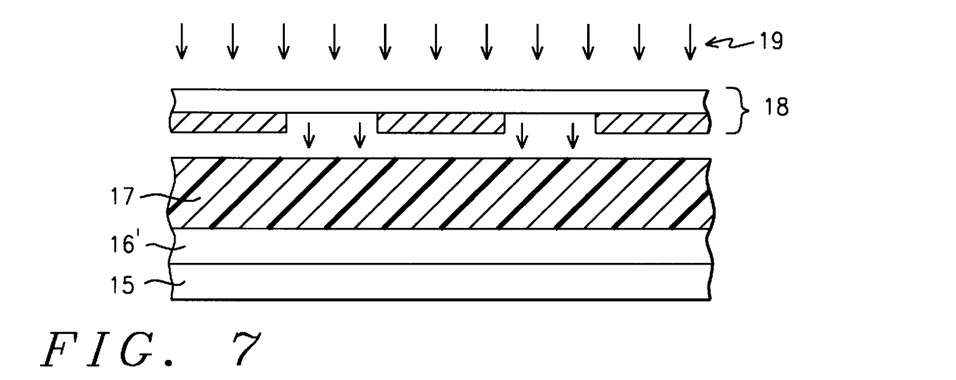

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but wherein there is formed upon the propylene glycol methyl ether derivatized silicon containing layer 16' a blanket positive hydrophobic photoresist layer 17. Although the first preferred embodiment of the present invention illustrates the present invention employing the blanket positive hydrophobic photoresist layer 17, a blanket photoresist layer within the method of the present invention may also be formed from a negative photoresist material. Preferably, the blanket positive hydrophobic photoresist layer 17 is formed to a thickness of from about 6000 to about 20000 angstroms.

As is understood by a person skilled in the art, the first preferred embodiment of the present invention provides particular value within integrated circuit microelectronics fabrication when the blanket positive hydrophobic photoresist layer 17 is formed from a deep ultraviolet (DUV) photoresist material whose patterning is induced by a photogenerated acid which makes more soluble in a developer solution photoexposed portions of the deep ultraviolet (DUV) photoresist material. Under such circumstances, the acetic acid generated from the condensation of the pendant surface hydroxyl groups of the hydrated hydrophilic silicon containing layer 16 and the propylene glycol methyl ether acetate molecules does not interfere with the photogenerated acid induced deep ultraviolet (DUV) photoresist material solubilization reaction as does the amine or ammonia generated from condensation of the pendant surface hydroxyl groups with hexamethyldisilazane (HMDS) as discussed within the Description of the Related Art. Similarly, since acetic acid is a very weak acid and photogenerated acids formed within deep ultraviolet (DUV) photoresist material photogenerated acid solubilization reactions are typically quite strong acids, residues of the acetic acid generated incident to the condensation reaction of the surface hydroxyls of the hydrated hydrophilic silicon containing layer 16 within the propylene glycol methyl ether acetate do not substantially solubilize the deep ultraviolet (DUV) photoresist material in areas other than where it is intended to be solubilized when employed within the blanket positive hydrophobic photoresist layer 17.

Shown also in FIG. 7 is a photoexposure reticle 18 positioned above the blanket positive hydrophobic photoresist layer 17 and a photoexposure radiation beam 19 photoexposing portions of the blanket positive hydrophobic photoresist layer 17 while employing the photoexposure reticle 18 as a mask.

Figure 8:
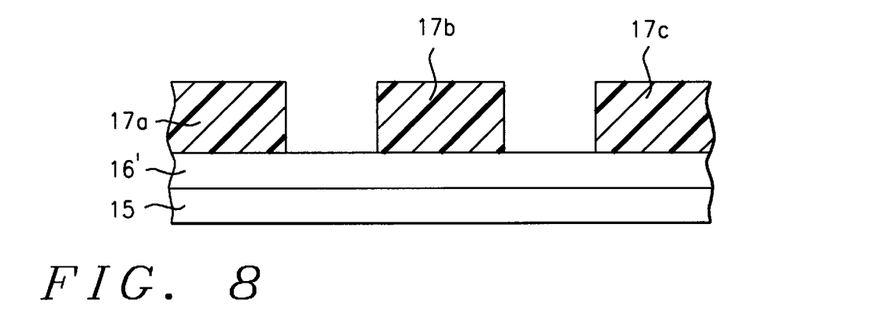

Referring now to FIG. 8, there is shown a schematic cross-sectional diagram illustrating the results of further processing of the microelectronics fabrication whose schematic cross-sectional diagram is illustrated in FIG. 7. Shown in FIG. 8 is a schematic cross-sectional diagram of a microelectronics fabrication otherwise equivalent to the microelectronics fabrication whose schematic cross-sectional diagram is illustrated in FIG. 7, but wherein the photoexposed blanket positive hydrophobic photoresist layer 17 has been developed to form the patterned positive hydrophobic photoresist layers 17a, 17b and 17c. As is illustrated within FIG. 8, within the first preferred embodiment of the present invention the patterned positive hydrophobic photoresist layers 17a, 17b and 17c are formed completely developed and exposing the propylene glycol methyl ether derivatized silicon containing layer 16', without any undeveloped residue remaining adjoining the propylene glycol methyl ether derivatized silicon containing layer 16', or any "T" top residue, as is seen, for comparison purposes, within the partially patterned photoresist layer 12' as illustrated within FIG. 4 and discussed within the Description of the Related Art.

Upon forming the microelectronics fabrication whose schematic cross-sectional diagram is illustrated in FIG. 8, there is formed a microelectronics fabrication having formed therein a series of patterned hydrophobic photoresist material layers upon a hydrated hydrophilic material layer with enhanced adhesion without employing an organofunctional silane adhesion promoter material layer interposed between the patterned hydrophobic photoresist material layers and the hydrated hydrophilic material layer. In addition, when the patterned hydrophobic photoresist layers are formed from a positive deep ultraviolet (DUV) photoresist material whose photoexposure provides a photogenerated acid which solubilizes the positive deep ultraviolet (DUV) photoresist material, the patterned hydrophobic photoresist layers so formed are formed without insoluble photoresist residue layers bridging to the patterned positive deep ultraviolet (DUV) hydrophobic photoresist layers.

For comparison purposes with respect to the prior art, the surface tension of propylene glycol methyl ether acetate is about 26.4 dyne/cm at ambient conditions, which is comparable to the surface tension typical observed for photoresist materials (about 23 dyne/cm) and also comparable to the surface tension of a silicon oxide surface after treatment with a hexamethyldisilazane (HMDS) adhesion promoter material (about 25 dyne/cm).

Second Preferred Embodiment

Referring now to FIG. 9 to FIG. 16, there is show a series of schematic cross-sectional diagrams illustrating the results of forming within an integrated circuit microelectronics fabrication in accord with a more specific embodiment of the present invention which comprises a second preferred embodiment of the present invention two patterned hydrated hydrophilic silicon containing dielectric layers while employing two patterned hydrophobic photoresist layers whose adhesion is promoted upon the patterned hydrophilic silicon containing dielectric layers by derivatizing the patterned hydrophilic silicon containing dielectric layers with a propylene glycol methyl ether acetate derivatizing material in accord with the method of the present invention.

Figure 9:
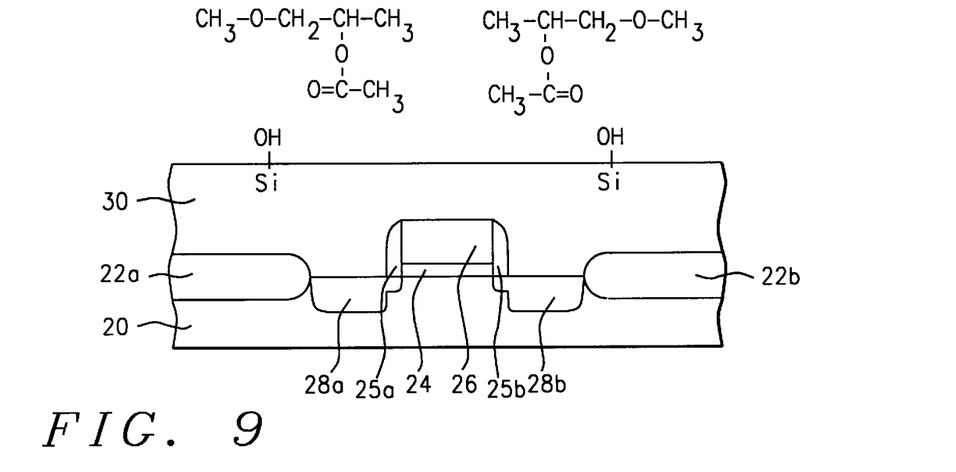
FIG. 9 to FIG. 16 show a series of schematic cross-sectional diagrams illustrating the results of forming within an integrated circuit microelectronics fabrication in accord with a more specific embodiment of the present invention which comprises a second preferred embodiment of the present invention two patterned hydrated hydrophilic silicon containing dielectric layers while employing two patterned hydrophobic photoresist layers whose adhesion is promoted upon the patterned hydrophilic silicon containing dielectric layers by derivatizing the patterned hydrophilic silicon containing dielectric layers with a propylene glycol methyl ether acetate derivatizing material in accord with the method of the present invention.

Shown in FIG. 9 is a schematic cross-sectional diagram of the integrated circuit microelectronics fabrication at an early stage in its fabrication.

Shown in FIG. 9 is a semiconductor substrate 20 having formed within and upon its surface a pair of isolation regions 22a and 22b which define an active region of the semiconductor substrate 20. Although it is known in the art of integrated circuit microelectronics fabrication that semiconductor substrates are available with either dopant polarity, various dopant concentrations and several crystallographic orientations, for the second preferred embodiment of the present invention the semiconductor substrate 20 is preferably a (100) silicon semiconductor substrate having an N- or P- doping.

Similarly, although it is also known in the art of integrated circuit microelectronics fabrication that isolation regions may be formed within and/or upon semiconductor substrates to define active regions of those semiconductor substrates through methods including but not limited to isolation region thermal growth methods and isolation region deposition/patterning methods, for the second preferred embodiment of the present invention the isolation regions 22a and 22b are preferably formed within and upon the semiconductor substrate 20 to define the active region of the semiconductor substrate 20 through an isolation region thermal growth method at a temperature of from about 800 to about 1200 degrees centigrade to form the isolation regions 22a and 22b of silicon oxide within and upon the semiconductor substrate 20.

Shown also within FIG. 9 formed within and upon the active region of the semiconductor substrate 20 is a field effect transistor (FET) which comprise a series of structures including: (1) a gate dielectric layer 24 formed upon the active region of the semiconductor substrate 20, the gate dielectric layer 24 having formed and aligned thereupon; (2) a gate electrode 26; (3) a pair of insulator spacers 25a and 25b formed adjoining a pair of opposite edges of the gate dielectric layer 24 and the gate electrode 26; and (4) a pair of source/drain regions 28a and 28b formed within the active region of the semiconductor substrate 20 at areas not covered by the gate dielectric layer 24 and the gate electrode 26. Each of the structures within the series of structures which comprises the field effect transistor (FET) may be formed through methods and materials which are conventional in the art of field effect transistor (FET) fabrication.

For example, although it is known in the art of field effect transistor (FET) fabrication that gate dielectric layers may be formed through patterning, through methods as are conventional in the art, of blanket gate dielectric layers formed upon active regions of semiconductor substrates through methods including but not limited to blanket gate dielectric layer thermal growth methods and blanket gate dielectric layer deposition/patterning methods, for the second preferred embodiment of the present invention the gate dielectric layer 24 is preferably formed through patterning, through methods as are conventional in the art, of a blanket gate dielectric layer formed through a blanket gate dielectric layer thermal growth method at a temperature of from about 800 to about 1000 degrees centigrade to form the gate dielectric layer 24 of silicon oxide of thickness about 50 to about 150 angstroms upon the active region of the semiconductor substrate 20.

Similarly, although it is also know in the art of field effect transistor (FET) fabrication that gate electrodes may be formed through patterning, through methods as are conventional in the art, of blanket gate electrode material layers formed of gate electrode materials including but not limited to metals, metal alloys, doped polysilicon or polycides (doped polysilicon/metal silicide stacks), for the second preferred embodiment of the present invention the gate electrode 26 is preferably formed through patterning, through methods as are conventional in the art, of a blanket layer of a doped polysilicon or a polycide gate electrode material formed upon the blanket gate dielectric layer to a thickness of from about 800 to about 2000 angstroms.

Yet similarly, as is also known in the art of field effect transistor (FET) fabrication, the pair of dielectric spacer layers 25a and 25b is preferably formed through an anisotropic etching of a blanket conformal dielectric layer formed upon the gate electrode 26 and the gate dielectric layer 24. The blanket conformal dielectric layer is typically and preferably formed from a dielectric material selected from the group including but not limited to silicon oxide dielectric materials, silicon nitride dielectric materials and silicon oxynitride dielectric materials.

Finally, it is also known in the art of field effect transistor (FET) fabrication that source/drain regions are typically formed into active regions of a semiconductor substrate through ion implantation methods employing dopant ions of polarity opposite the polarity of the semiconductor substrate within which is formed those source/drain regions. For the second preferred embodiment of the present invention, the source/drain regions 28a and 28b are preferably formed within the active region of the semiconductor substrate 20 employing: (1) a low dose ion implant of from about 1E12 to about 1E13 dopant ions per square centimeter and an ion implantation energy of from about 10 to about 100 keV while employing the gate electrode 26 and the gate dielectric layer 24 as an ion implantation mask; followed by (2) a high dose ion implant at an ion implant dose of from about 1E15 to about 5E16 dopant ions per square centimeter and at an ion implantation energy of from about 10 to about 100 keV while employing the gate electrode 26, the gate dielectric layer 24 and the pair of dielectric spacer layers 25a and 25b as an ion implantation mask. The low dose ion implant and the high dose ion implant are of polarity appropriate to the field effect transistor (FET) and the semiconductor substrate 20.

There is also shown within FIG. 9 formed over the semiconductor substrate 20 and the series of structures which forms the field effect transistor (FET) a planarized pre-metal dielectric (PMD) layer 30. Methods and materials through which planarized pre-metal dielectric (PMD) layers may be formed within integrated circuit microelectronics fabrications are known in the art of integrated circuit microelectronics fabrication. Planarized pre-metal dielectric (PMD) layers may be formed within integrated circuit microelectronics fabrications through methods including but not limited to chemical vapor deposition (CVD) methods, plasma enhanced chemical vapor deposition (PECVD) methods and physical vapor deposition (PVD) sputtering methods, along with reactive ion etch (RIE) etchback planarizing methods and chemical mechanical polish (CMP) planarizing methods, through which may be formed planarized pre-metal dielectric (PMD) layers of dielectric materials including but not limited to silicon oxide dielectric materials, silicon nitride dielectric materials and silicon oxynitride dielectric materials. For the second preferred embodiment of the present invention, the planarized pre-metal dielectric (PMD) layer 30 is preferably formed of a silicon oxide dielectric material deposited employing a plasma enhanced chemical vapor deposition (PECVD) method and subsequently planarized employing a chemical mechanical polish (CMP) planarizing method, as is common in the art of integrated circuit microelectronics fabrication. Other methods and materials may, however, also be employed in forming the planarized pre-metal dielectric (PMD) layer 30. Preferably, the planarized pre-metal dielectric (PMD) layer 30 so formed is formed to a thickness of from about 3000 to about 15000 angstroms over the semiconductor substrate 20 and the series of structures which forms the field effect transistor (FET).

As is illustrated within the schematic cross-sectional diagram of FIG. 9, the planarized pre-metal dielectric (PMD) layer 30, similarly with the blanket hydrated hydrophilic silicon containing layer 16 within the first preferred embodiment of the present invention as illustrated within FIG. 5, has formed thereupon covalently bonded pendent hydroxyl groups which, at least in part, provide the planarized pre-metal dielectric (PMD) layer 30 with a hydrophilic surface. Similarly, as is also illustrated within the schematic cross-sectional diagram of FIG. 9, and as is also consistent with the first preferred embodiment of the present invention as illustrated within the schematic cross-sectional diagram of FIG. 5, there is provided in the vicinity of the planarized pre-metal dielectric (PMD) layer 30 a pair of propylene glycol methyl ether acetate molecules through methods and materials as are analogous or equivalent to the methods and materials employed within the first preferred embodiment of the present invention.

Figure 10:
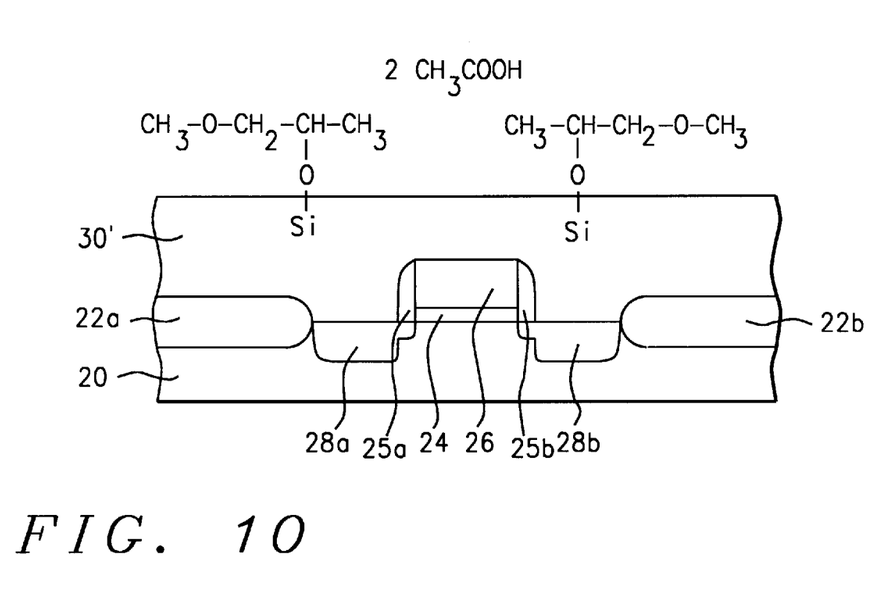

Referring now to FIG. 10, there is shown a schematic cross-sectional diagram illustrating the results of further processing of the integrated circuit microelectronics fabrication whose schematic cross-sectional diagram is illustrated in FIG. 9. Shown in FIG. 10, analogously with the first preferred embodiment of the present invention as illustrated by the microelectronics fabrication whose schematic cross-sectional diagram is illustrated within FIG. 6, is the formation of a propylene glycol methyl ether derivatized blanket planarized pre-metal dielectric (PMD) layer 30' through condensation and covalent bond formation between the pendant hydroxyl groups of the blanket planarized pre-metal dielectric (PMD) layer 30 and the propylene glycol methyl ether acetate molecules, along with the formation of an equimolar quantity acetic acid.

Figure 11:
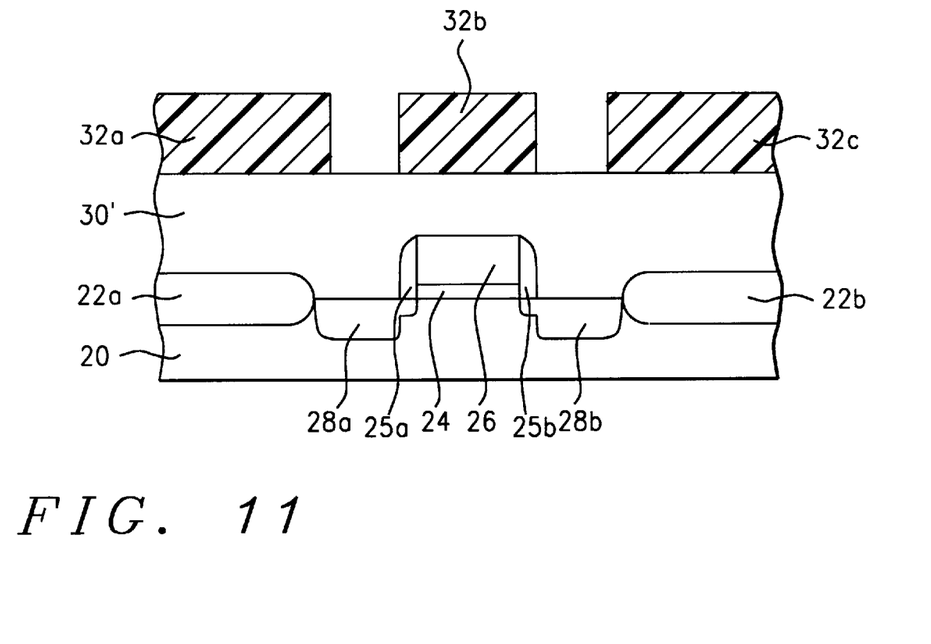

Referring now to FIG. 11, there is shown a schematic cross-sectional diagram illustrating the results of further processing of the integrated circuit microelectronics fabrication whose schematic cross-sectional diagram is illustrated in FIG. 10. Shown in FIG. 11 is a schematic cross-sectional diagram of an integrated circuit microelectronics fabrication otherwise equivalent to the integrated circuit microelectronics fabrication whose schematic cross-sectional diagram is illustrated in FIG. 10, but wherein there is formed upon the propylene glycol methyl ether derivatized blanket planarized pre-metal dielectric (PMD) layer 30' a series of patterned first photoresist layers 32a, 32b and 32c. Within the second preferred embodiment of the present invention, the series of patterned first photoresist layers 32a, 32b and 32c is preferably formed employing methods and materials analogous or equivalent to the methods and materials through which is formed the series of patterned photoresist layers 17a, 17b and 17c within the first preferred embodiment of the present invention as illustrated within the schematic cross-sectional diagram of FIG. 8.

Figure 12:
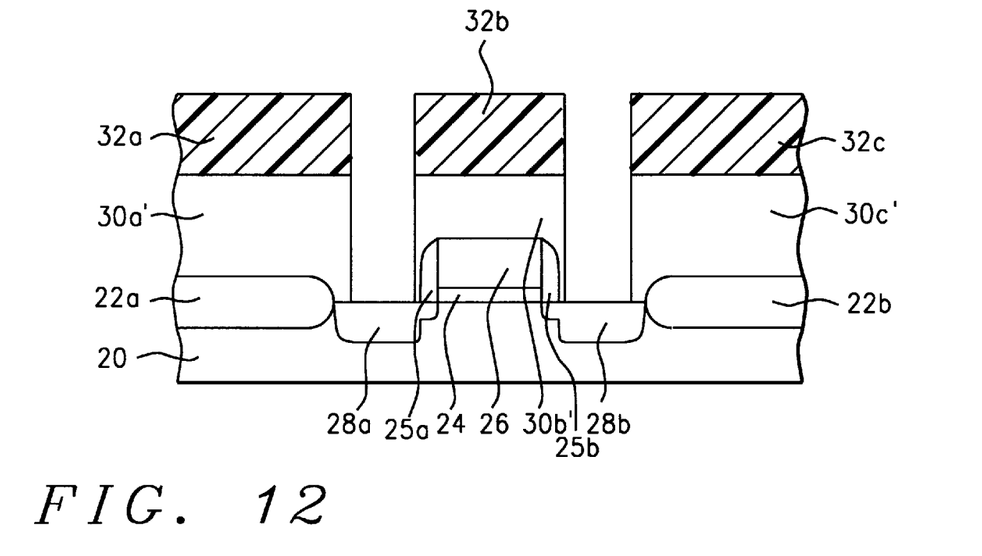

Referring now to FIG. 12, there is shown a schematic cross-sectional diagram illustrating the results of further processing of the integrated circuit microelectronics fabrication whose schematic cross-sectional diagram is illustrated in FIG. 11. Shown in FIG. 12 is a schematic cross-sectional diagram of an integrated circuit microelectronics fabrication otherwise equivalent to the integrated circuit microelectronics fabrication whose schematic cross-sectional diagram is illustrated in FIG. 11, but wherein the propylene glycol methyl ether derivatized blanket planarized pre-metal dielectric (PMD) layer 30' has been patterned to form the propylene glycol methyl ether derivatized patterned planarized pre-metal dielectric (PMD) layers 30a', 30b' and 30c' which define a pair of apertures which access the source/drain regions 28a and 28b. The propylene glycol methyl ether derivatized blanket planarized pre-metal dielectric (PMD) layer 30' as illustrated within FIG. 11 is patterned to form the patterned propylene glycol methyl ether derivatized patterned planarized pre-metal dielectric (PMD) layers 30a', 30b' and 30c' as illustrated within FIG. 12 through methods as are conventional in the art of integrated circuit microelectronics fabrication, which will typically include, but are not limited to, plasma etch methods employing fluorine containing etchant gas compositions.

Figure 13:
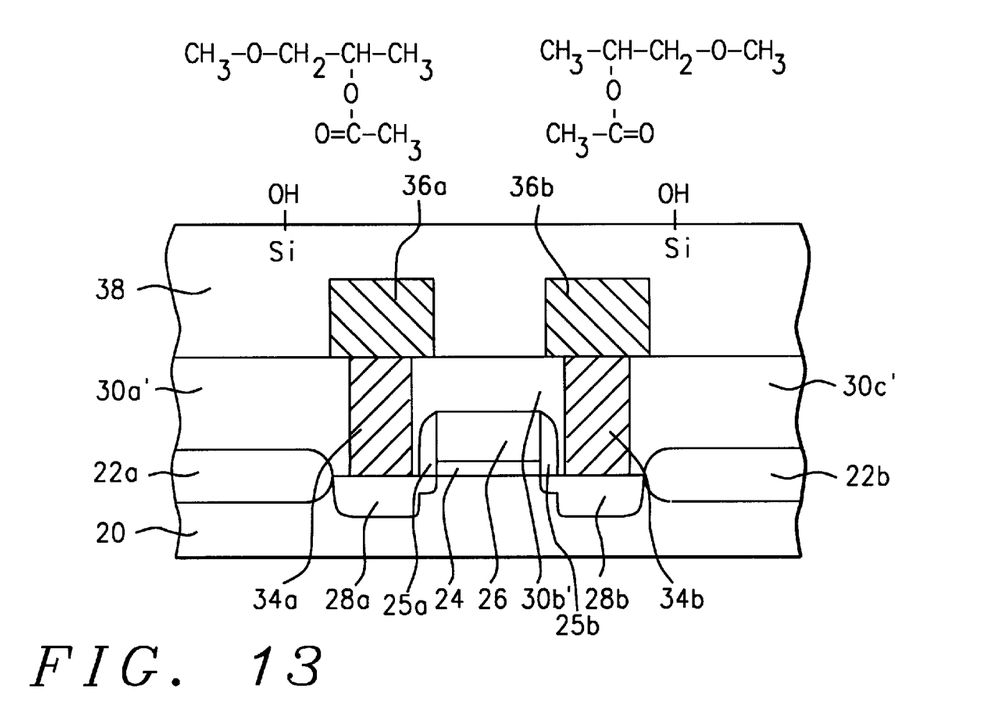

Referring now to FIG. 13, there is shown a schematic cross-sectional diagram illustrating the results of further processing of the integrated circuit microelectronics fabrication whose schematic cross-sectional diagram is illustrated in FIG. 12. Shown in FIG. 13 is a schematic cross-sectional diagram of an integrated circuit microelectronics fabrication otherwise equivalent to the integrated circuit microelectronics fabrication whose schematic cross-sectional diagram is illustrated in FIG. 12, but wherein in part the patterned first photoresist layers 32a, 32b and 32c have been stripped from the integrated circuit microelectronics fabrication. The patterned first photoresist layers 32a, 32b and 32c may be stripped from the integrated circuit microelectronics fabrication whose schematic cross-sectional diagram is illustrated in FIG. 12 to form in part the integrated circuit microelectronics fabrication whose schematic cross-sectional diagram is illustrated within FIG. 13 through methods as are conventional in the art of integrated circuit microelectronics fabrication. Such methods will typically include, but are not limited to, wet chemical stripping methods and dry oxygen plasma stripping methods.

Also shown in FIG. 13 is a pair of conductive contact stud layers 34a and 34b formed within the pair of apertures defined by the series of propylene glycol methyl ether derivatized patterned planarized pre-metal dielectric (PMD) layers 30a', 30b' and 30c', and a pair of patterned first conductor layers 36a and 36b formed contacting the pair of conductive contact stud layers 34a and 34b. Within the second preferred embodiment of the present invention, the pair of conductive contact stud layers 34a and 34b and the pair of patterned first conductor layers 36a and 36b are preferably formed through methods and materials as are conventionally employed in forming such layers within integrated circuit microelectronics fabrication. Such methods typically include thermally assisted evaporation methods, electron beam assisted evaporation methods, chemical vapor deposition (CVD) methods and physical vapor deposition (PVD) sputtering methods through which may be formed conductive contact stud layers and patterned conductor layers of formed of metals, metal alloys, doped polysilicon and polycides. For the second preferred embodiment of the present invention, the pair of conductive contact stud layers 34a and 34b is preferably formed at least in part of a tungsten material, as is conventional in the art of integrated circuit microelectronics fabrication, while the pair of patterned first conductor layers 36a and 36b is preferably formed at least in part of an aluminum containing conductor material, as is similarly also conventional in the art of integrated circuit microelectronics fabrication.

Preferably, the pair of conductive contact stud layers 34a and 34b is formed to a thickness sufficient to reach the upper surfaces of the propylene glycol methyl ether derivatized patterned planarized pre-metal dielectric (PMD) layers 30a', 30b' and 30c' while simultaneously contacting the corresponding source/drain region 28a or 28b, while the pair of patterned first conductor layers 36a and 36b is formed to a thickness of from about 2000 to about 6000 angstroms contacting the pair of conductive contact stud layers 34a and 34b.

There is also shown in FIG. 13: (1) a blanket planarized inter-metal dielectric (IMD) layer 38 having pendent hydroxyl groups covalently bonded thereto, where the blanket planarized inter-metal dielectric (IMD) layer 38 is formed upon the propylene glycol methyl ether derivatized patterned planarized pre-metal dielectric (PMD) layers 30a', 30b' and 30c' and the patterned first conductor layers 36a and 36b; and (2) a pair of propylene glycol methyl ether acetate molecules in the vicinity of the blanket planarized inter-metal dielectric (IMD) layer 38. Within the second preferred embodiment of the present invention, the blanket planarized intermetal dielectric (IMD) layer 38 is formed employing methods materials and dimensions analogous or equivalent to the methods, materials and dimensions employed in forming the blanket planarized pre-metal dielectric (PMD) layer 30 as illustrated within FIG. 9.

Figure 14:
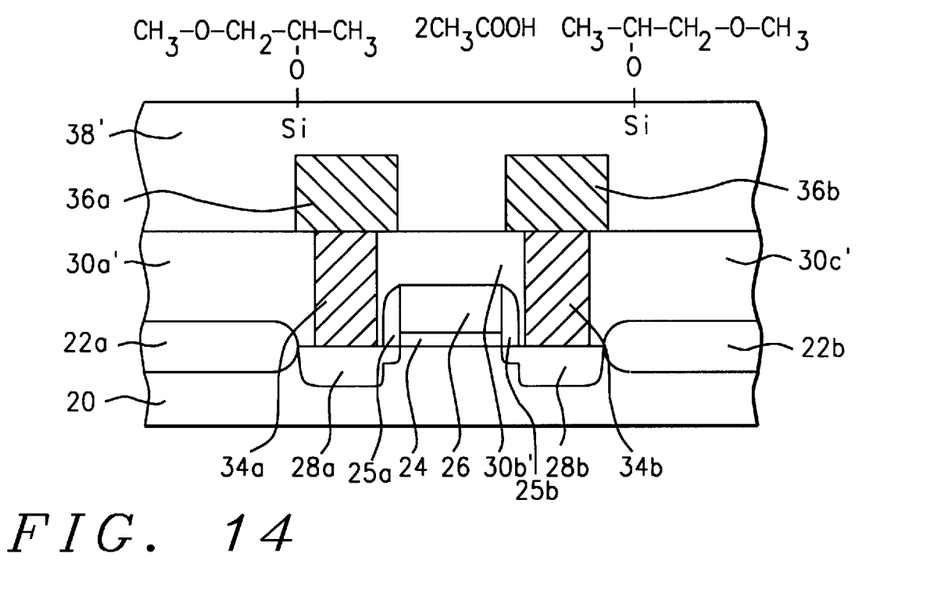

Referring now to FIG. 14, there is shown a schematic cross-sectional diagram illustrating the results of further processing of the integrated circuit microelectronics fabrication whose schematic cross-sectional diagram is illustrated in FIG. 13. Shown in FIG. 14 is a schematic cross-sectional diagram of an integrated circuit microelectronics fabrication otherwise equivalent to the integrated circuit microelectronics fabrication whose schematic cross-sectional diagram is illustrated in FIG. 13, but wherein the pendent hydroxyl groups within the blanket planarized inter-metal dielectric (IMD) layer 38 have been reacted with the propylene glycol methyl ether acetate molecules to form the propylene glycol methyl ether derivatized blanket planarized inter-metal dielectric (IMD) layer 38'. The propylene glycol methyl ether derivatized blanket planarized inter-metal dielectric (IMD) layer 38' as illustrated within the schematic cross-sectional diagram of FIG. 14 is formed employing methods and materials analogous or equivalent to the methods and materials through which is formed the propylene glycol methyl ether derivatized blanket planarized pre-metal dielectric layer 30' as illustrated within the schematic cross-sectional diagram of FIG. 10.

Figure 15:
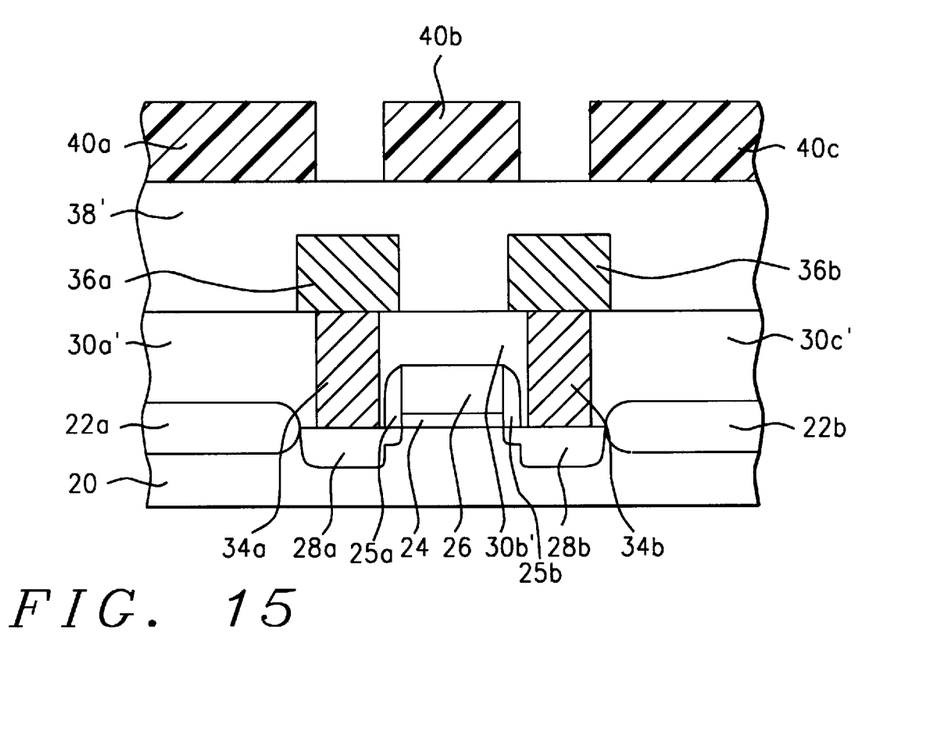

Referring now to FIG. 15 there is shown a schematic cross-sectional diagram illustrating the results of further processing of the integrated circuit microelectronics fabrication whose schematic cross-sectional diagram is illustrated in FIG. 14. Shown in FIG. 15 is a schematic cross-sectional diagram of an integrated circuit microelectronics fabrication otherwise equivalent to the integrated circuit microelectronics fabrication whose schematic cross-sectional diagram is illustrated in FIG. 14, but wherein there is formed upon the propylene glycol methyl ether derivatized blanket planarized inter-metal dielectric (IMD) layer 38' a series of patterned second photoresist layers 40a, 40b and 40c. The series of patterned second photoresist layers 40a, 40b and 40c as illustrated within the integrated circuit microelectronics fabrication whose schematic cross-sectional diagram is illustrated within FIG. 15 is preferably formed employing methods and materials analogous or equivalent to the methods and materials employed in forming the series of patterned first photoresist layers 32a, 32b and 32c within the integrated circuit microelectronics fabrication whose schematic cross-sectional diagram is illustrated in FIG. 11.

Figure 16:
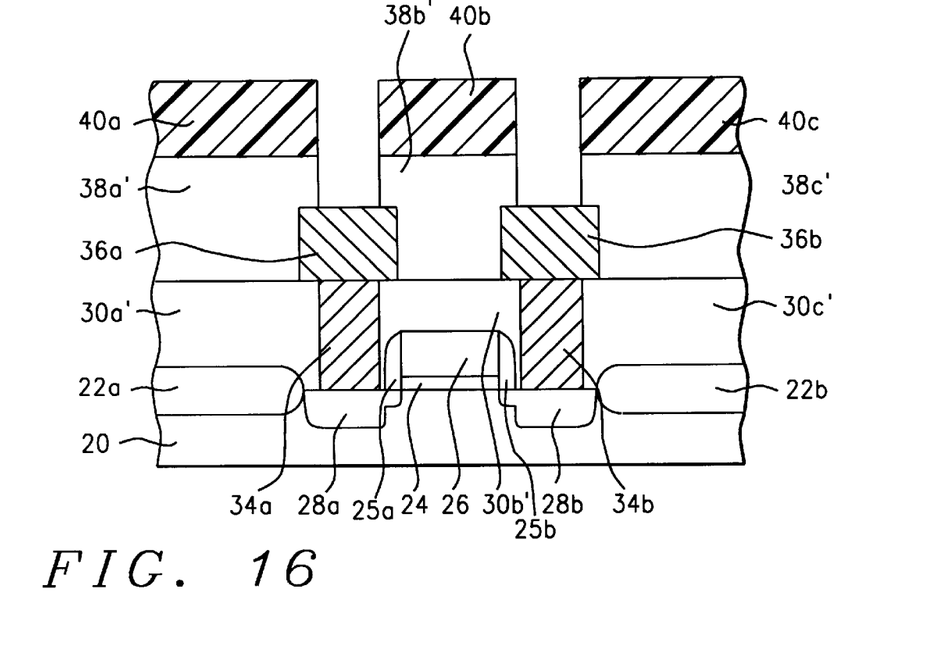

Referring now to FIG. 16, there is shown a schematic cross-sectional diagram illustrating the results of further processing of the integrated circuit microelectronics fabrication whose schematic cross-sectional diagram is illustrated in FIG. 15. Shown in FIG. 16 is a schematic cross-sectional diagram of an integrated circuit microelectronics fabrication otherwise equivalent to the integrated circuit microelectronics fabrication whose schematic cross-sectional diagram is illustrated in FIG. 15, but wherein the propylene glycol methyl ether derivatized blanket planarized inter-metal dielectric (IMD) layer 38' has been patterned to form the propylene glycol methyl ether derivatized patterned planarized inter-metal dielectric (MD) layers 38a', 38b' and 38c'. The propylene glycol methyl ether derivatized patterned planarized inter-metal dielectric (IMD) layers 38a', 38b' and 38c' as illustrated within FIG. 16 are formed from the propylene glycol methyl ether derivatized blanket planarized inter-metal dielectric (IMD) layer 38' as illustrated within FIG. 15 employing methods and materials analogous or equivalent to the methods and materials through which the propylene glycol methyl ether patterned planarized pre-metal dielectric (PMD) layers 30a', 30b' and 30c' as illustrated in FIG. 12 are formed from the propylene glycol methyl ether derivatized blanket planarized pre-metal dielectric (PMD) layer 30' as illustrated in FIG. 11.

Upon forming the integrated circuit microelectronics fabrication whose schematic cross-sectional diagram is illustrated in FIG. 16, there is formed an integrated circuit microelectronics fabrication having formed therein two series of vias through two separate dielectric layers which are formed of hydrophilic materials while employing two series of patterned photoresist layers formed of hydrophobic materials, with enhanced adhesion of the patterned photoresist layers to the patterned dielectric layers, without employing an organofunctional silane adhesion promoter material layer interposed between the patterned photoresist layers and the patterned dielectric layers.

As is understood by a person skilled in the art, the preferred embodiments of the present invention are illustrative of the present invention rather than limiting of the present invention. Revisions and modification may be made to methods, materials, structures and dimensions through which are formed microelectronics fabrications in accord with the preferred embodiments of the present invention while still providing fabrications formed in accord with a method which is within the spirit and scope of the present invention, as defined by the accompanying claims.

What is claimed is:

1. A method for forming a hydrophobic material layer upon a hydrophilic material layer over a substrate comprising:

providing a substrate;

forming over the substrate a hydrated hydrophilic material layer;

treating the hydrated hydrophilic material layer with a glycol ether acetate material in the absence of an organofunctional silane material to form a glycol ether derivatized hydrophilic material layer having a glycol ether moiety covalently bonded thereto through condensation of the hydrated hydrophilic material layer with the glycol ether acetate material; and forming upon the glycol ether derivatized hydrophilic material layer a hydrophobic material layer.

2. The method of claim 1 wherein the substrate is employed within a microelectronics fabrication selected from the group consisting of integrated circuit microelectronics fabrications, solar cell microelectronics fabrications, ceramic substrate microelectronics fabrications and flat panel display microelectronics fabrications.

3. The method of claim 1 wherein the hydrated hydrophilic material layer is a hydrated oxide layer.

4. The method of claim 1 wherein the glycol ether acetate material is selected from the group consisting of glycol alkyl ether acetate materials.

5. The method of claim 1 wherein the hydrophobic material layer is an organic polymer material layer.

6. The method of claim 5 wherein the organic polymer material layer is a photoresist layer.

7. A method for forming a photoresist material layer upon a hydrated oxide material layer within a microelectronics fabrication comprising:

providing a substrate employed within a microelectronics fabrication;

forming over the substrate a hydrated oxide material layer;

treating the hydrated oxide material layer with a glycol ether acetate material in absence of an organofunctional silane material to form a glycol ether derivatized hydrated oxide material layer having a glycol ether moiety covalently bonded thereto through condensation of the hydrated oxide material layer with the glycol ether acetate material; and forming upon the glycol ether derivatized hydrated oxide material layer a photoresist material layer.

8. The method of claim 7 wherein the photoresist material layer employs a positive photoresist material which is solubilized within a developer through action of a photogenerated acid material.

9. The method of claim 8 wherein the photoresist material layer is uniformly solubilized when photoexposed due to absence of a mobile base material formed incident to the condensation of the hydrated oxide material layer and the glycol ether acetate material.

10. The method of claim 7 wherein the microelectronics fabrication is selected from the group consisting of integrated circuit microelectronics fabrications, solar cell microelectronics fabrications, ceramic substrate microelectronics fabrications and flat panel display microelectronics fabrications.

11. The method of claim 7 wherein the glycol ether acetate material is selected from the group consisting of glycol alkyl ether acetate materials.

* * * * *